United States Patent [19]
Suyama et al.

[11] Patent Number: 5,654,536
[45] Date of Patent: Aug. 5, 1997

[54] PHOTOMULTIPLIER HAVING A MULTILAYER SEMICONDUCTOR DEVICE

[75] Inventors: Motohiro Suyama; Masaharu Muramatsu; Makoto Oishi; Yoshitaka Ishikawa; Koei Yamamoto, all of Hamamatsu, Japan

[73] Assignee: Hamamatsu Photonics K.K., Hamamatsu, Japan

[21] Appl. No.: 557,541

[22] Filed: Nov. 14, 1995

[30] Foreign Application Priority Data

Nov. 24, 1994 [JP] Japan .................................. 6-290070

[51] Int. Cl.$^6$ ...................................................... H01J 40/14
[52] U.S. Cl. .................................. 250/207; 250/214 VT; 257/10; 313/532
[58] Field of Search ........................... 250/207, 214 VT; 257/10, 189, 609; 313/532, 528, 530, 103 R, 385, 386

[56] References Cited

U.S. PATENT DOCUMENTS

| | | | |
|---|---|---|---|
| 5,101,100 | 3/1992 | Kinoshita et al. | 250/214 VT |
| 5,120,949 | 6/1992 | Tomasetti | 250/207 |
| 5,146,296 | 9/1992 | Huth . | |
| 5,177,350 | 1/1993 | Beauvais et al. | 250/214 VT |

FOREIGN PATENT DOCUMENTS

| | | |
|---|---|---|
| 50-54290 | 5/1975 | Japan . |
| 57-10987 | 1/1982 | Japan . |
| 6-243795 | 9/1994 | Japan . |
| 6-318447 | 11/1994 | Japan . |

OTHER PUBLICATIONS

Fagen, "Vacuum Avalanche Photodiodes can Count Single Photons", Laser Focus World, Nov. 1993, pp. 125–132.

van Geest et al, "Hybrid Phototube With Si Target", Nuclear Instruments and Methods in Physics Research A310, pp. 261–266, North Holland, Jan. 1991.

DeSalvo et al, "First Results on the Hybrid Photodiode Tube", Nuclear Instruments and Methods in Physics Reasearch A315, pp. 375–384, North Holland, Jan. 1992.

Basa et al, "Test Results of the First Proximity Focused Hybrid Photodiode Detector Prototypes", Nuclear Instruments and Methods in Physics Research A330, pp. 93–99, North Holland, Jan. 1993.

LaRue et al, "High Quantum Efficiency Photomultiplier with Fast Time Response", SPIE, vol. 2022 Photodetectors and Power Meters, pp. 64–73, Jan. 1993.

(List continued on next page.)

*Primary Examiner*—Que Le
*Attorney, Agent, or Firm*—Cushman Darby & Cushman, IP Group of Pillsbury Madison & Sutro, LLP

[57] ABSTRACT

In a photomultiplier of the present invention, a semiconductor device arranged in an envelope to oppose a photocathode is constituted by a semiconductor substrate of a first conductivity type, a carrier multiplication layer of a second conductivity type different from the first conductivity type, which is formed on the semiconductor substrate by opitaxial growth, a breakdown voltage control layer of the second conductivity type, which is formed on the carrier multiplication layer and has a dopant concentration higher than that of the carrier multiplication layer, a first insulating layer formed on the breakdown voltage control layer and said carrier multiplication layer while partially exposing the surface of the breakdown voltage control layer as a receptor for photoelectrons and consisting of a nitride, and an ohmic electrode layer formed on a peripheral surface portion of the receptor of the breakdown voltage control layer. When the dopant concentration distribution in the carrier multiplication layer is uniformly controlled on the basis of epitaxial growth, the uniformity of an avalanche multiplication gain for photoelectrons incident at different positions on the receptor of the semiconductor device is improved, thereby largely increasing the energy resolving power.

14 Claims, 3 Drawing Sheets

OTHER PUBLICATIONS

Suyama et al, "Fundamental Investigation of Vacuum PD Tube", IEEE Transactions on Nuclear Science, vol. 41, No. 4, Aug. 1994, p. 724.

Cushman et al, "A Photomultiplier Tube Incorporating an Avalanche Photodiode", Nuclear Instruments and Methods in Physics Research A333, pp. 381–390, North Holland, Jan. 1993.

D'Ambrosio et al, "Photon Counting With a Hybrid Photomultiplier Tube" (HPMT), Nuclear Instruments and Methods in Physics Research A338, pp. 389–397, North Holland, Jan. 1994.

PHOTOMULTIPLIER HAVING A MULTILAYER SEMICONDUCTOR DEVICE

BACKGROUND OF THE INVENTION

1. Field of the Invention

The present invention relates to a photomultiplier for detecting weak light which cannot be perceived by eyes at a sensitivity reaching a quantum limit and, more particularly, to a photomultiplier for quantitatively measuring fluorescence generated from a biological microsubstance by single-photoelectron counting.

2. Related Background Art

Conventionally, various photomultipliers are available. For example, there are photomultipliers incorporating APDs (Avalanche PhotoDiode) as semiconductor devices for amplifying and detecting photoelectrons emitted from a photocathode. Such an APD, especially, a bulk-type APD is constituted by various conductive areas formed on a semiconductor substrate by diffusion or ion implantation.

Prior arts related to a photomultiplier incorporating an APD are described in detail in the following references:

U.S. Pat. No. 5,146,296, September, 1992,

LASER FOCUS WORLD, pp. 125–132, November, 1993.

In such a photomultiplier, an avalanche multiplication gain for photoelectrons changes largely depending on the incident positions of the photoelectrons in the APD.

A prior art related to a photomultiplier incorporating an electron lens is disclosed in, e.g., U.S. Pat. No. 5,120,949.

Prior arts related to a photomultiplier incorporating a PD (PhotoDiode) in place of an APD are disclosed in detail in the following references:

*Nucl. Instr. and Meth.*, vol. A310, pp. 261–266, 1991,

*Nucl. Instr. and Meth.*, vol. A315, pp. 375–384, 1992,

*Nucl. Instr. and Meth.*, vol. A330, pp. 93–99, 1993,

HYBRID PHOTOMULTIPLIER TUBES, Delft Electronische Producten.

SUMMARY OF THE INVENTION

In the above conventional photomultiplier incorporating an APD and an electron lens, the range for focusing photoelectrons emitted from the photocathode by the electron lens onto the receptor of the APD is limited in principle. In addition, in the conventional photomultiplier incorporating a PD, the total gain of PD is too small to easily detect a single photoelectron.

It is an object of the present invention to provide an electron tube incorporating a semiconductor device having an avalanche multiplication layer, and serving as a photomultiplier which improves the uniformity of an avalanche multiplication gain for photoelectrons incident on different positions of the receptor of the semiconductor device, thereby largely increasing the energy resolving power.

To achieve the above object, according to the present invention, there is provided a photomultiplier comprising an envelope whose interior is held in a high-vacuum state, a photocathode, formed on a vacuum-side surface of an incident window of the envelope, for emitting photoelectrons excited by light incident on an air-side surface of the incident window into a vacuum, and a semiconductor device, arranged in the envelope to oppose the photocathode, for detecting the photoelectrons emitted from the photocathode, wherein the semiconductor device is constituted by (a) a semiconductor substrate of a first conductivity type, (b) a carrier multiplication layer of a second conductivity type different from the first conductivity type, which is formed on the semiconductor substrate by epitaxial growth, (c) a breakdown voltage control layer of the second conductivity type formed on the carrier multiplication layer and having a dopant concentration higher than that of the carrier multiplication layer, (d) a first insulating layer formed on the breakdown voltage control layer and the carrier multiplication layer while partially exposing a surface of the breakdown voltage control layer as a receptor for the photoelectrons and consisting of a nitride, and (e) an ohmic electrode layer formed on a peripheral surface portion of the receptor of the breakdown voltage control layer.

In a photomultiplier with the above arrangement, when predetermined voltages are applied from an external voltage source to the photocathode and the semiconductor device, an electric field from the semiconductor device toward the photocathode is formed in the envelope. When predetermined voltages as reverse bias voltages are applied from the external voltage source to the semiconductor substrate and the ohmic electrode layer of the semiconductor device, a depletion layer including an avalanche multiplication region) extends from a junction interface between the semiconductor substrate and the carrier multiplication layer toward the breakdown voltage control layer.

At this time, when external weak light is incident on the incident window of the envelope as photons, these photons are absorbed by the photocathode through the incident window. For this reason, electrons located in the valence band of the photocathode are excited to the conduction band, and emitted into the vacuum as photoelectrons by a function of negative electron affinity. The photoelectrons emitted from the photocathode are incident on the receptor of the semiconductor device while moving against the electric field from the semiconductor device toward the photocathode.

The photoelectron incident on the receptor of the semiconductor device generates an electron-hole pair every time a predetermined energy is lost in the carrier multiplication layer. Therefore, several thousands electron-hole pairs are generated as secondary carriers upon incidence of a single photoelectron. Since the gain for photoelectrons in this process, i.e., the electron irradiation gain is determined by the incident energy of photoelectrons, a satisfactory distribution is obtained with respect to the incident positions of the photoelectrons on the receptor of the semiconductor device.

The secondary carriers multiplied immediately after this electron irradiation drift against the electric field from the carrier multiplication layer toward the semiconductor substrate or the breakdown voltage control layer. The carriers of one type, which are generated as the secondary carriers, reach the avalanche multiplication region formed in the carrier multiplication layer.

Such drifting carriers of one type repeat an ionization process upon collision with atoms constituting the carrier multiplication layer, i.e., an avalanche multiplication process, and further generate tens times electron-hole pairs. The avalanche-multiplied secondary carriers continuously drift against the electric field from the carrier multiplication layer toward the semiconductor substrate or the breakdown voltage control layer and reach the semiconductor substrate or the breakdown voltage control layer.

Since the carrier multiplication layer is epitaxially grown on the semiconductor substrate of a conductivity type different from that of the carrier multiplication layer, the dopant distribution is very uniformly controlled. For this reason, the dependency of the gain for carriers in the avalanche multiplication process, i.e., the avalanche multiplication gain on the generation positions of the carriers in the carrier multiplication layer decreases to obtain a satisfactory distribution.

A reverse current corresponding to the multiplication amount of carriers is output from the ohmic electrode layer to an external arithmetic unit. Therefore, when the number of photons incident on the photomultiplier is sequentially individually detected, weak light which cannot be perceived by eyes can be quantitatively measured at a sensitivity reaching a quantum limit by single-photoelectron counting.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
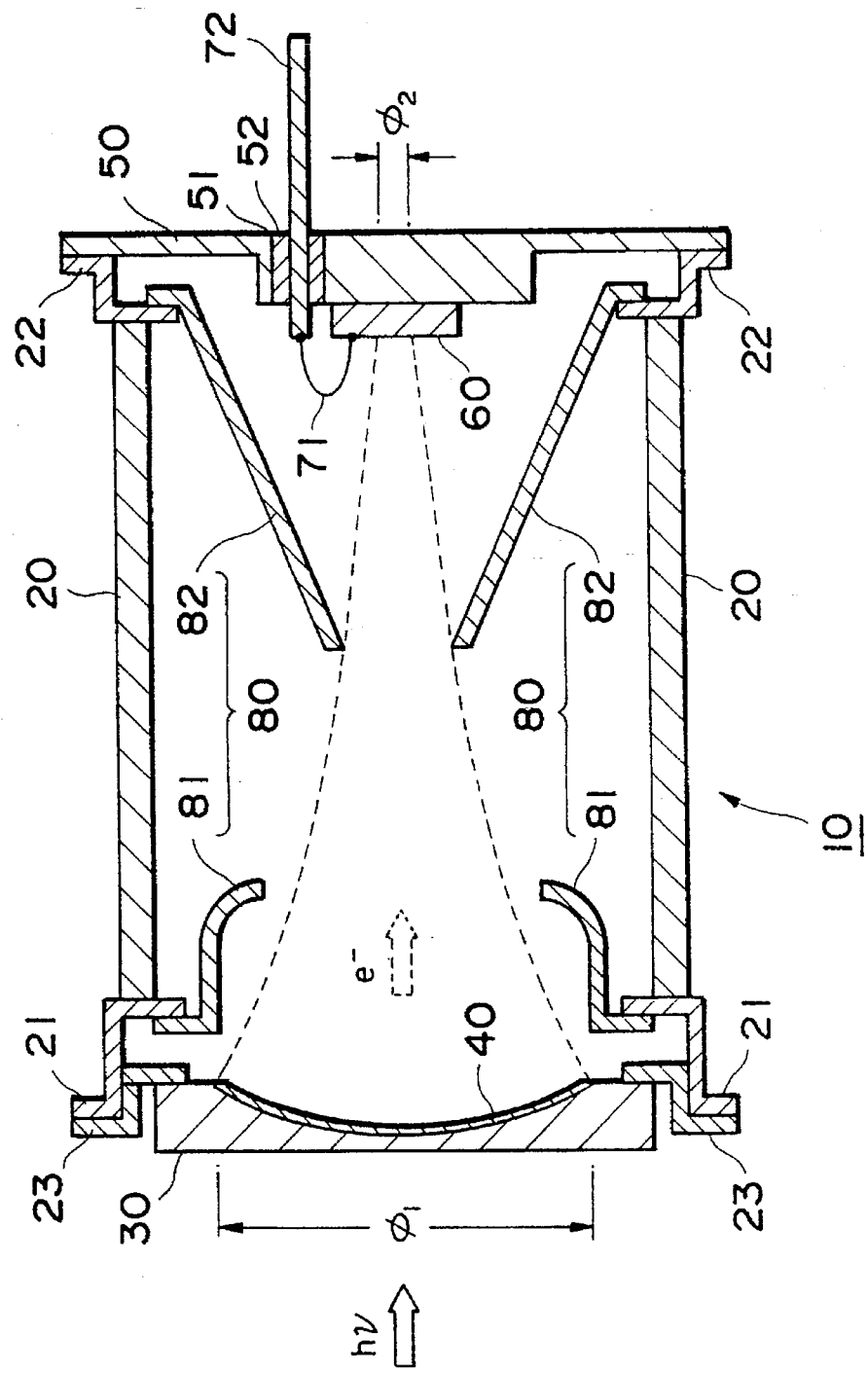
FIG. 1 is a sectional view showing the structure of a photomultiplier according to the first embodiment of the present invention.

The arrangement and function of a photomultiplier according to an embodiment of the present invention will be described below in detail with reference to FIGS. 1 to 5. The same reference numerals denote the same devices throughout the drawings, and a detailed description thereof will be omitted. The dimensional ratio in the drawings does not necessarily coincide with that in the description.

First Embodiment

As shown in FIG. 1, a photomultiplier 10 of this embodiment has a structure in which the two ends of a hollow cylindrical envelope 20 are hermetically sealed with an incident window 30 and a stem 50, and the interior is kept in a high-vacuum state at a pressure of about $10^{-8}$ Torr. In this photomultiplier 10, two focusing electrodes 81 and 82 as an electron lens 80 are arranged near the incident window 30 and the stem 50, respectively, and a semiconductor device 60 is arranged on the stem 50.

The envelope 20 is a hollow cylindrical horizontal tube formed of glass. Hollow cylindrical fitting members 21 and 22 bent at two portions are set at the two ends of the envelope 20. The fitting members 21 and 22 are formed of a Kovar metal.

The incident window 30 is a disk-like plate formed of glass and has a flat surface on the air side and a concave surface on the vacuum side. A hollow cylindrical fitting member 23 bent at two portions is arranged at the vacuum-side peripheral portion of the incident window 30. The envelope 20 and the incident window 30 are integrally fixed by partially welding the end portions of the two fitting members 21 and 23. Note that the glass material of the incident window 30 has transparency with respect to the wavelength of light as a measurement target.

The stem 50 is a disk-like metal plate and has a projecting portion as the arrangement area of the semiconductor device 60 on the vacuum side. The envelope 20 and the stem 50 are integrally constituted by partially welding the vacuum-side peripheral portion of the envelope 20 and the end portion of the fitting member 22. A through hole 51 for receiving a terminal rod 72 (to be described later) of the semiconductor device 60 is formed near the central portion of the stem 50. The stem 50 is formed of a Kovar metal.

A thin film-like photocathode 40 is deposited on the vacuum-side surface of the incident window 30. This photocathode 40 is applied with a predetermined voltage from an external voltage source (not shown) through the filling member 23 and held at a potential of, e.g., about 15 kV. The photocathode 40 is formed of an alkali metal such as K, Na, Cs, or Sb. In the photocathode 4Ω, a diameter φ, of an area for receiving incident light hv and photoelectrically converting the incident light at a predetermined quantum efficiency to generate photoelectrons e⁻ is about 16 mm.

The cup-like focusing electrode 81 with an opening, which is bent at one portion, is joined with the end portion of the fitting member 21 by partial welding. The focusing electrode 81 has a shape tapered toward the stem 50. The focusing electrode 81 is applied with the same voltage as that applied to the photocathode 40 from the external voltage source (not shown) through the fitting member 21 and held at a potential of, e.g., about −15 kV. Note that the focusing electrode 81 is formed of stainless steel.

The hollow conical focusing electrode 82 with an opening, which is bent at one portion, is joined with the end portion of the fitting member 22 by partial welding. The focusing electrode 82 has a shape expanding toward the stem 50. The focusing electrode 82 is applied with a predetermined voltage from the external voltage source (not shown) through the fitting member 22 and held at a potential of, e.g., about 0 V. Note that the focusing electrode 82 is formed of stainless steel.

The semiconductor device 60 is arranged on the vacuum-side projecting portion of the stem 50 while causing a receptor 65 (to be described later) to oppose the photocathode 40. An electrode layer 68 (to be described later) of the semiconductor device 60 and the metal terminal rod 72 hermetically extending through the through hole 51 of the stem 50 are bonded at the two end portions of a metal wire 71 to be electrically connected to each other.

The upper surface of the semiconductor device 60 is applied with a predetermined voltage from the external voltage source (not shown) through the terminal rod 72 and the wire 71 and held at a potential of, e.g., about −145 V. The lower surface of the semiconductor device 60 is applied with the same voltage as that applied to the focusing electrode 82 from the external voltage source (not shown) through the stem 50 and held at a potential of, e.g., about 0 V. Therefore, a reverse bias voltage is applied to the semiconductor device 60 as a whole.

The terminal rod 72 is connected to an external arithmetic unit (not shown) for processing a detection signal output from the semiconductor device 60. A cylindrical insulating member 52 is hermetically sealed and arranged between the through hole 51 and the terminal rod 72. In the semiconductor device 60, a diameter $\phi_2$ of an area for receiving the photoelectrons $e^-$ and effectively multiplying them at a predetermined multiplication factor is about 3 mm.

Figure 2:
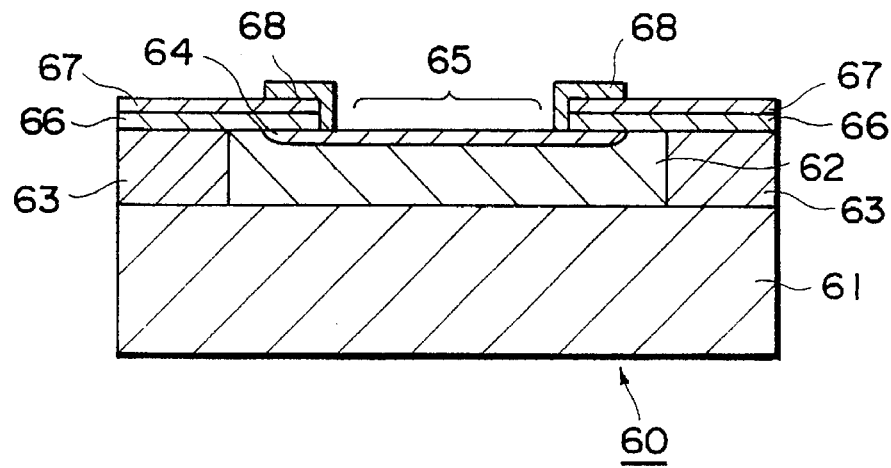
FIG. 2 is a sectional view showing the structure of a semiconductor device in the photomultiplier in FIG. 1.

As shown in FIG. 2, the prismatic semiconductor device 60 is a semiconductor detector constituted as an APD. In the semiconductor device 60, the receptor 65 (to be described later) is irradiated with the photoelectrons $e^-$ emitted from the photocathode 40 and focused by the electron lens 80, and an avalanche multiplication region (to be described later) amplifies the photoelectrons $e^-$ reaching from the receptor 65.

A disk-like carrier multiplication layer 62 is formed on the central portion of a flat plate-like semiconductor substrate 61. An annular guard ring layer 63 having the same thickness as that of the carrier multiplication layer 62 is formed on the periphoral portion of the semiconductor substrate 61. A disk-like breakdown voltage control layer 64 is formed on the contral surface region of the carrier multiplication layer 62.

The semiconductor substrate 61 is heavily doped monocrystalline wafer formed of Si of a first conductivity type, e.g., n+ type. The semiconductor substrate 61 is doped with P or Si as an n-type dopant at a concentration of about $10^{18}$ cm$^{-3}$ and has a thickness of about 500 μm and a resistivity of about 0.01 Ω·cm.

The carrier multiplication layer 62 is a lightly doped semiconductor layer formed by epitaxially growing Si of a second conductivity type different from the first conductivity type, e.g., a p type, on the semiconductor substrate 61. The carrier multiplication layer 62 is doped with B as a p-type dopant at a concentration of about $10^{14}$ to $10^{16}$ cm$^{-3}$ and has a thickness of about 10 μm and a resistivity of about 1 to 100 Ω·cm. The dopant concentration of the carrier multiplication layer 62 is set to a value for forming a depletion layer extending from the junction interface between the semiconductor substrate 61 and the carrier multiplication layer 62 toward the breakdown voltage control layer 64 upon application of a voltage close to the breakdown voltage.

A thickness d of the carrier multiplication layer 62 which is epitaxially grown while holding a satisfactory crystallinity is preferably set within a range of about 5 to 50 μm. If the thickness d is larger than about 50 μm, the nonuniformity of the dopant concentration in the direction of thickness becomes conspicuous to degrade the uniformity of the avalanche multiplication gain for the photoelectrons $e^-$ depending on the generation positions of carriers. On the other hand, if the thickness d is smaller than about 5 μm, the depletion layer extending from the semiconductor substrate 61 becomes thinner to decrease the electron irradiation gain for the photoelectrons e.

In this case, the thickness d is set to about 10 μm. This is because some margins to the maximum range or about 3 μm of the photoelectrons $e^-$ irradiated at an acceleration energy of about 15 keV and the thickness of about 3 μm of the avalanche multiplication region (to be described later) are taken into consideration to minimize fluctuations in electron irradiation gain for the photoelectrons $e^-$.

The guard ring layer 63 is a heavily doped semiconductor layer formed by thermally diffusing a dopant of the first conductivity type, e.g., an n-type dopant into the peripheral portion of the carrier multiplication layer 62. This guard ring layer 63 has a thickness of about 10 μm which is the same as that of the carrier multiplication layer 62. The guard ring layer 63 is doped with P as an n-type dopant at a concentration of about $10^{19}$ cm$^{-3}$ which is equal to that of the semiconductor substrate 61.

The breakdown voltage control layer 64 is a heavily doped semiconductor layer formed by thermally diffusing a dopant of the second conductivity type different from the first conductivity type, e.g., a p-type dopant into the central surface area of the carrier multiplication layer 62. The breakdown voltage control layer 64 has a thickness of about 1 μm and is doped with B as a p-type dopant at a concentration of about $10^{19}$ cm$^{-2}$ which is equal to that of the semiconductor substrate 61. The circular receptor 65 is exposed to the central surface portion of the breakdown voltage control layer 64 to oppose the photocathode 40.

Note that, in the receptor 65, the diameter $\phi_2$ of the area for receiving the photoelectrons $e^-$ and amplifying them at a predetermined multiplication factor is preferably set to about 10 mm or less. If the diameter $\phi_2$ is larger than about 10 mm, the nonuniformity of the dopant concentration in the direction of surface becomes conspicuous to degrade the uniformity of the avalanche multiplication gain for the photoelectrons $e^-$ depending on the generation positions of carriers. In addition, since the capacitance of the avalanche multiplication region becomes large, the operation speed is decreased.

The two different insulating layers 66 and 67 are sequentially formed on almost the entire peripheral surface portion of the breakdown voltage control layer 64, which is located at the peripheral portion of the receptive portion 65, and the entire surface of the guard ring layer 63. The insulating layer 66 is an insulating thin film formed of Si oxide. The thickness of the insulating layer 66 is about 200 nm. The insulating layer 67 is an insulating thin film formed of Si nitride. The thickness of the insulating layer 67 is about 50 nm.

The insulating layer 66 is formed by oxidizing the surface region of the carrier multiplication layer 62 in advance, thereby holding satisfactory crystallinity of the carrier multiplication layer 62. The insulating layer 67 is deposited on the insulating layer 66 to prevent degradation in the semiconductor characteristics of the carrier multiplication layer 62, the guard ring layer 63, and the breakdown voltage control layer 64 in formation of the photocathode 40.

Note that the photocathode 40 is formed by depositing an alkali metal such as K, Na, Cs, or Sb on the vacuum side surface of the incident window 30. The alkali metal considerably degrades the characteristics of the semiconductor device. For this reason, it is indispensable and essential that the carrier multiplication layer 62, the guard ring layer 63, and the breakdown voltage control layer 64 are protected by the insulating layer 67 consisting of a nitride.

An annular ohmic electrode layer 68 is formed on the insulating layer 67 to be in contact with the peripheral surface portion of the breakdown voltage control layer 64 along the side walls of the insulating layers 66 and 67. The ohmic electrode layer 68 is a thin metal film formed of Al and has a good ohmic contact with respect to the breakdown voltage control layer 64.

Note that the ohmic electrode layer 68 is applied with a predetermined voltage from the external voltage source (not shown) through the terminal rod 72 bonded with the wire 71 and held at a negative potential of, e.g., −145 V. The semiconductor substrate 61 arranged on the stem 50 is applied with a predetermined voltage from the external voltage source (not shown) and held at a ground (GND) potential of 0 V. Therefore, a depletion layer including an avalanche multiplication region near the junction interface is formed in the carrier multiplication layer 62 between the n⁺-type semiconductor substrate 61 and the p⁺-type breakdown voltage control layer 64.

The electron irradiation gain until the photoelectrons e⁻ incident on the receptor 65 reach the avalanche multiplication region is about $4\times10^3$. The avalanche multiplication gain until these carriers pass through the avalanche multiplication region and reach the semiconductor substrate 61 is about 30. Therefore, the gain of secondary electrons for the photoelectrons e⁻ is about $10^4$.

The structure of a hyperabrupt junction type APD like an abrupt junction type APD is described in detail in, e.g., Japanese Patent Laid-Open No. 50-54290.

Steps in manufacturing the semiconductor device 60 in this embodiment will be described below.

In the first step, p-type Si is epitaxially grown on the entire surface of the semiconductor substrate 61 consisting of n⁺-type Si on the basis of normal CVD (Chemical Vapor Deposition), thereby forming the p-type carrier multiplication layer 62. Subsequently, the surface region of the carrier multiplication layer 62 is oxidized on the basis of normal thermal oxidation, thereby forming the insulating layer 66 consisting of Si oxide.

At the subsequent stage of the first step, P as an n-type dopant is selectively diffused into the carrier multiplication layer 62 located under the peripheral portion of the insulating layer 66 on the basis of normal thermal diffusion, thereby forming the n⁺-type guard ring layer 63. Subsequently, B as a p-type dopant is selectively diffused into the carrier multiplication layer 62 located under the central portion of the insulating layer 66 on the basis of normal thermal diffusion, thereby forming the p⁺-type breakdown voltage control layer 64.

In the second step, Si nitride is deposited on the entire surface of the insulating layer 66 on the basis of normal CVD, thereby forming the insulating layer 67. Subsequently, an mask layer with a central circular opening is formed on the peripheral portion of the insulating layer 67 on the basis of normal photolithography. The central portions of the insulating layers 66 and 67 are removed to expose the surface of the breakdown voltage control layer 64 on the basis of normal dry etching, thereby forming the receptor 65.

At the subsequent stage of the second step, Al is deposited on the receptor 65 and the insulating layer 67 on the basis of normal vacuum deposition, thereby forming the ohmic electrode layer 68. Subsequently, an annular mask layer is formed on the surface region of the ohmic electrode layer 68 from the inner portion of the insulating layer 67 to the outer portion of the breakdown voltage control layer 64 on the basis of normal photolithography. After the ohmic electrode layer 68 on the peripheral portion of the insulating layer 67 and the central portion of the breakdown voltage control layer 64 is removed on the basis of normal wet etching, the mask layer on the completed ohmic electrode layer 68 is removed.

The operation of this embodiment will be described below.

When predetermined voltages are applied from the external voltage source to the photocathode 40 and the stem 50, the same predetermined potential is generated in the photocathode 40 and the focusing electrode 61, and at the same time, the same predetermined potential is generated in the stem 50 and the focusing electrode 82. At this time, the potential of the stem 50 and the focusing electrode 82 is higher than that of the photocathode 40 and the focusing electrode 81. For this reason, an electric field from the semiconductor device 60 toward the photocathode 40 through the openings of the two focusing electrodes 81 and 82 is formed in the envelope or vacuum vessel 20.

When predetermined voltages as reverse bias voltages are applied from the external voltage source to the semiconductor substrate 61 and the ohmic electrode layer 65 of the semiconductor device 60, a depletion layer extends from the junction interface between the semiconductor substrate 61 and the carrier multiplication layer 62 toward the breakdown voltage control layer 64, and an avalanche multiplication region is formed because the potential of the semiconductor substrate 61 is higher than that of the ohmic electrode layer 68.

When weak external light, e.g., fluorescence generated from a biological microsubstance is incident on the light-receiving portion of the incident window 30 as the photons hv, the photons hv are absorbed by the photocathode 40 through the incident window 30. For this reason, electrons located in the valence band of the photocathode 40 are excited to the conduction band and emitted into the vacuum as the photoelectrons e⁻ by a function of negative electron affinity. The photoelectrons e⁻ emitted from the photocathode 40 in this manner move against the electric field open from the stem 50 toward the photocathode 40 through the electron lens 80 and are incident on the receptor 65 of the semiconductor device 60.

In principle, it is impossible to focus the photoelectrons e emitted from the photocathode 40 on one point on the receptor 65 by the electron lens 80. However, the photoelectrons e⁻ can be focused to a portion almost corresponding to the diameter $\phi_2$ of the receptor 65. For this reason, photoelectrons e⁻ are respectively incident at different positions of the receptor 65.

The photoelectron e⁻ incident on the receptor 65 of the semiconductor device 60 generates an electron-hole pair every time an energy of about 3.6 eV is lost in the carrier multiplication layer 62. For this reason, several thousands electron-hole pairs are generated as secondary carriers upon incidence of single photoelectrons e⁻. The multiplied secondary carriers drift against the electric field from the semiconductor substrate 61 toward the breakdown voltage control layer 64. Secondary electrons in the secondary carriers reach the avalanche multiplication region formed in the carrier multiplication layer 62. At this time, the electron irradiation gain for the photoelectrons e⁻ is about $4\times10^3$.

The secondary electrons drifting to the avalanche multiplication region repeat an avalanche multiplication process for causing ionization upon collision with atoms constituting the carrier multiplication layer 62. The multiplied secondary electrons drift against the electric field from the semiconductor substrate 61 toward the carrier multiplication layer 62 and reach the semiconductor substrate 61. At this time, the avalanche multiplication gain for the first secondary electrons is about 30, and the total gain of electrons for the photoelectrons e⁻ is about $10^5$.

Since the p-type carrier multiplication layer 62 is epitaxially grown on the n*-type semiconductor substrate 61, the dopant distribution in the carrier multiplication layer 62 is very uniformly controlled. For this reason, the dependency of the avalanche multiplication gain on the generation positions of the secondary electrons in the avalanche multiplication region decreases to achieve satisfactory uniformity.

A reverse current corresponding to the multiplication amount of secondary electrons is output from the ohmic electrode layer 68 to the external arithmetic unit through the wire 71 and the terminal rod 72. The number of photons incident on the photomultiplier 10 is sequentially individually detected on the basis of driving of the external arithmetic unit. Therefore, weak light which cannot be perceived by eyes can be quantitatively measured at a sensitivity reaching the quantum limit by single-photoelectron counting.

A photomultiplier sample according to this embodiment and a photomultiplier sample of the prior art were manufactured, and an experiment for comparing the performance specifications of these two photomultipliers was conducted.

The photomultiplier sample manufactured on the basis of this embodiment had the same structure as that of the photomultiplier of this embodiment. In the semiconductor device, a carrier multiplication layer was formed by epitaxial growth using Si as a semiconductor material. On the other hand, the photomultiplier sample manufactured on the basis of the prior art was constituted as a normal photomultiplier having 12 stage dynodes as an electron multiplication unit.

In the photomultiplier sample of the prior art, the first-stage dynode of the electron multiplication unit was formed of GaP, and the second- to twelfth-stage dynodes of the electron multiplication unit were formed of Cu—Be. Therefore, the photomultiplier sample of the prior art had a maximum energy resolving power achievable in the prior art because of its material of the first-stage dynode.

Energy resolving powers were measured by irradiating a red light to the two photomultiplier samples. The experimental conditions for the photomultiplier sample manufactured on the basis of this embodiment were as follows:

Acceleration voltage to photoelectrons: −17 kV,

Bias voltage applied to semiconductor device:
145 V,

Amplifier connected to semiconductor device.
Ortec Model 142A,

Light source: LED (RED),

Ambient temperature: 25°.

The experimental conditions for the photomultiplier sample manufactured on the basis of the prior art were as follows:

Acceleration voltage to photoelectrons: −2.000 kV,

Amplifier connected to anode; Canberra Model 2005,

Light source; LED (RED),

Ambient temperature: 25°.

Figure 3:
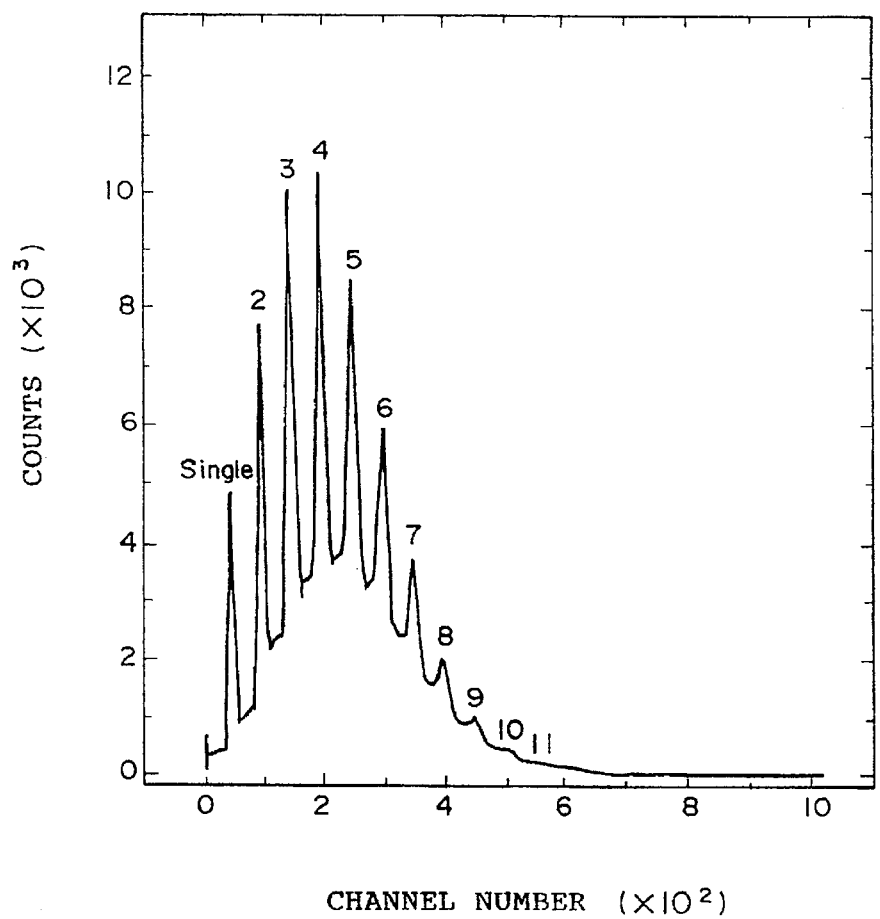
FIG. 3 is a graph for showing the result of output pulse peak measurement in a photomultiplier manufactured on the basis of the first embodiment.
Figure 4:
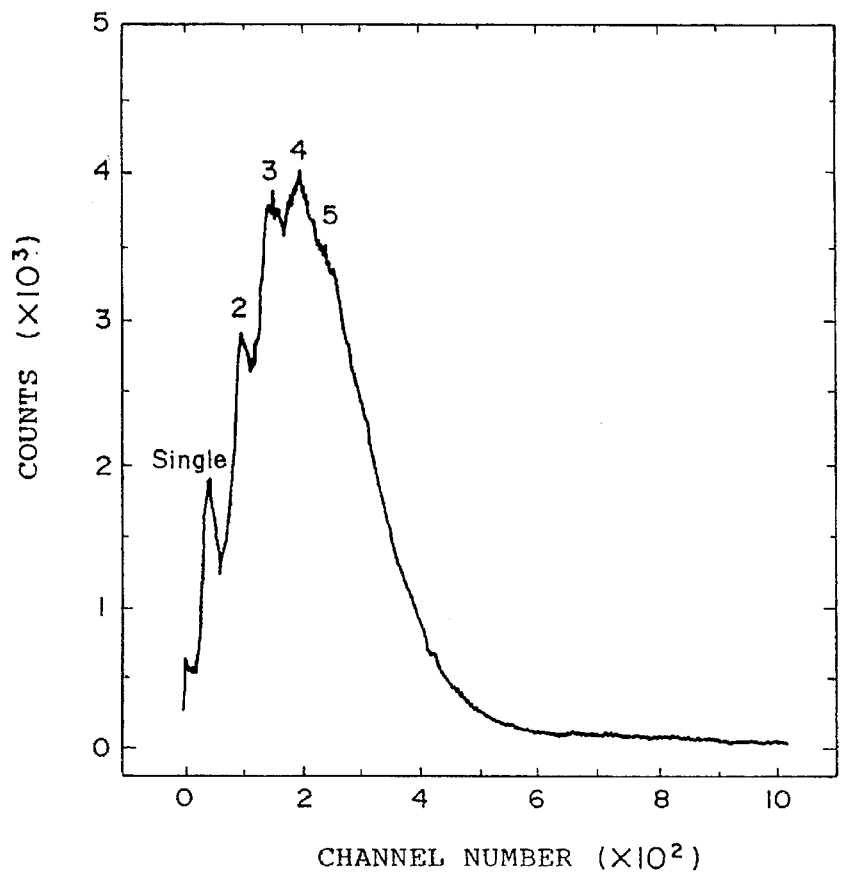
FIG. 4 is a graph for showing the result of output pulse peak measurement in a photomultiplier sample manufactured as a prior art.

FIG. 3 is a graph showing the output pulse peak distribution of the photomultiplier sample manufactured on the basis of this embodiment. FIG. 4 is a graph showing the output pulse peak distribution of the photomultiplier sample manufactured on the basis of the prior art. In these two graphs, a channel number corresponding to the energy amount of incident photons is plotted along the abscissa, and counts obtained upon detection of the incident photons having energy amounts corresponding to channel numbers are plotted along the ordinate.

As is apparent from these graphs, the conventional photomultiplier sample has an energy resolving power of 30% to 100% for a single photoelectron. In comparison, the photomultiplier sample of the present invention has a largely improved energy resolving power of 14% for a single photoelectron. In addition, even in consideration of noise by the amplifier connected to the semiconductor device or the anode, the energy resolving power for a single photoelectron rarely degrades in theory. Therefore, the energy resolving power for incident photons can be largely improved by achieving the uniformity of the gain in the carrier multiplication layer of the semiconductor device.

In a conventional electron tube incorporating a PD as a semiconductor device, an energy resolving power of 4.3% can be obtained for a single photoelectron under the ideal conditions for eliminating noise by the amplifier connected to the semiconductor device. However, the total gain for photoelectrons is as relatively small as about $4 \times 10^3$. For this reason, the energy resolving power for a single photoelectron is degraded to 40% to 70% under practical conditions considering noise by the amplifier.

In a conventional PMT (PhotoMultiplier Tube) incorporating multi-stage dynodes and an anode, the secondary electron multiplication factor by the first-stage dynode is as relatively small as 10. However, in the photomultiplier of the present invention, the secondary electron multiplication factor at the first-stage by electron irradation is $4 \times 10^3$, which is much larger than that of the conventional PMT. Note that, as compared to the conventional PMT, improvement of the energy resolving power of the photomultiplier of the present invention is achieved because of the large secondary electron multiplication factor at the first-multiplication-stage.

Second Embodiment

A photomultiplier according to this embodiment has the same structure as that of the photomultiplier of the first embodiment except for part of the semiconductor device.

Figure 5:
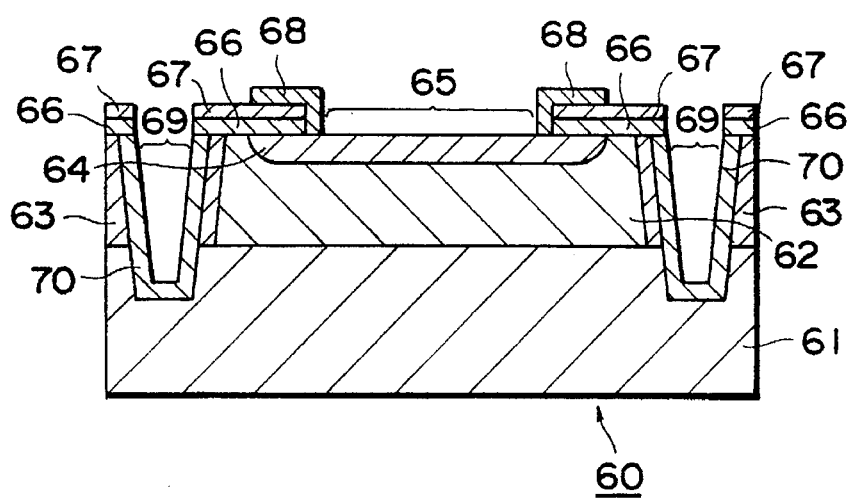
FIG. 5 is a sectional view showing the structure of a semiconductor device in a photomultiplier according to the second embodiment of the present invention.

As shown in FIG. 5, a prismatic semiconductor device 60 is constituted as an APD, as in the first embodiment. However, unlike the first embodiment, a carrier multiplication layer 62 is doped with D as a p-type dopant at a concentration of about $10^{13}$ to $10^{15}$ cm$^{-3}$ and has a thickness of about 30 μm and a resistivity of about 10 to 1,000 Ω·cm.

A guard ring layer 73 has a thickness of about 30 μm which is equal to that of the carrier multiplication layer 62.

In addition, unlike the first embodiment, a recessed annular isolation groove 69 is formed at the central portion of the guard ring layer 63 to a depth reaching the surface of a semiconductor substrate 61. An insulating layer 70 is deposited on the entire surface of the isolation groove 69 to prevent degradation in semiconductor characteristics of the carrier multiplication layer 62 in formation of a photocathode 40. The insulating layer 70 is an insulating thin film formed of Si nitride and having a thickness of about 100 nm.

The structure of an APD having such an isolation groove is described in detail in, e.g., Japanese Patent Laid-Open No. 57-10987.

Steps in manufacturing of this embodiment will be described below.

In the second step subsequent to the first step in manufacturing in the first embodiment, a mask layer with a peripheral annular opening is formed on the central portion of an insulating layer 66 on the basis of normal photolithography. Subsequently, the peripheral portions of the guard ring layer 63 is partially removed using a heated KOH solution as an etching solution to expose the surface of the semiconductor substrate 61 on the basis of normal wet etching, thereby forming the isolation groove 69. Si insulating layer 66 and the isolation groove 69 on the basis of normal CVD, thereby forming an insulating layer 67 and the insulating layer 70.

In the third step, an mask layer with a central circular opening is formed on the peripheral portion of the insulating layer 67 on the basis of normal photolithography. Subsequently, the central portions of the insulating layers 66 and 67 are removed to expose the surface of a breakdown voltage control layer 64 on the basis of normal dry etching, thereby forming a receptor 65. Al is deposited on the receptor 65 and the insulating layer 67 on the basis of normal vacuum deposition, thereby forming an ohmic electrode layer 68.

At the subsequent stage of the third step, an annular mask layer is formed on the surface region of the ohmic electrode layer 68 from the inner portion of the insulating layer 67 to the outer portion of the breakdown voltage control layer 64 on the basis of normal photolithography. Subsequently, after the ohmic electrode layer 68 on the peripheral portion of the insulating layer 67 and the central portion of the breakdown voltage control layer 64 is removed on the basis of normal wet etching, the mask layer on the completed ohmic electrode layer 68 is removed.

The function of this embodiment will be described below.

This embodiment has almost the same function as that of the photomultiplier of the first embodiment. However, the thickness and resistivity of the carrier multiplication layer 62 in the semiconductor device 60 are set to be larger than those in the first embodiment. With this arrangement, when a reverse bias voltage is applied to the inside of the semiconductor device 60 on the basis of driving of the external voltage source, a depletion layer extending from the junction interface between the semiconductor substrate 61 and the carrier multiplication layer 62 toward the breakdown voltage control layer 64 is formed to a relatively large thickness. For this reason, the capacitance of the depletion layer becomes small, so that the operation speed is increased. Therefore, weak light which cannot be perceived by eyes can be quantitatively measured at a higher sensitivity by single-photoelectron counting.

The present invention is not limited to the above embodiments, and various changes and modifications can also be made.

In the above embodiments, the receptor of the semiconductor device is exposed. However, the receptor of the semiconductor device may be preferably covered with an insulating layer consisting of a nitride when electrification due to irradiation of photoelectrons is very small.

In the above embodiments, the semiconductor substrate, the carrier multiplication layer, and the breakdown voltage control layer are formed of materials based on Si. However, as the materials of these semiconductor layers, InGaAs can also be preferably used.

In the above embodiments, n⁻, p, and p⁺ types are respectively set as the conductivity types of the semiconductor substrate, the carrier multiplication layer, and the breakdown voltage control layer. However, when these semiconductor layers are formed of materials based on Cc, almost the same effect as in the above embodiments can be obtained even when p⁺, n, and n⁺ types are respectively set as the conductivity types of the semiconductor substrate, the carrier multiplication layer, and the breakdown voltage control layer.

As has been described above in detail, in the photomultiplier of the present invention, when external weak light is incident on the incident window of the envelope as photons, photoelectrons are emitted from the photocathode and incident on the receptor of the semiconductor device. Secondary carriers generated when the photoelectrons lose the energy are multiplied by repeating a process for generating electron-hole pairs. Carriers of one type reaching the avalanche multiplication region are multiplied by repeating the avalanche multiplication process for ionizing the atoms constituting the carrier multiplication layer.

Since the carrier multiplication layer is epitaxially grown on the semiconductor substrate of a conductivity type different from that of the carrier multiplication layer, the dopant distribution is very uniformly controlled. For this reason, the dependency of the avalanche multiplication gain on the generation positions of carriers in the avalanche multiplication region decreases to obtain a distribution with satisfactory uniformity.

Since a reverse current corresponding to the multiplication amount of carriers is output from the ohmic electrode layer, the number of photons incident on the photomultiplier is sequentially individually detected. For this reason, unlike measurement using the conventional photomultiplier, which is limited to detect the presence/absence of incident photons, measurement using the photomultiplier of the present invention is expanded to quantitative measurement of the number of incident photons.

Therefore, according to the photomultiplier of the present invention, the energy resolving power is largely increased, so that weak light which cannot be perceived by eyes can be quantitatively measured at a sensitivity reaching the quantum limit by single-photoelectron counting.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 6-290070 (290070/1994) filed on Nov. 24, 1994, is hereby incorporated by reference.

What is claimed is:

1. A photomultiplier comprising:

an envelope whose interior is held in a high-vacuum state;

a photocathode, formed on the vacuum-side surface of an incident window of said envelope, for emitting photoelectrons excited by light incident on an air-side surface of said incident window into a vacuum; and a semiconductor device, arranged in said envelope to oppose said photocathode, for detecting the photoelectrons emitted from said photocathode, wherein said semiconductor device is constituted by a semiconductor substrate of a first conductivity type, a carrier multiplication layer of a second conductivity type difference from the first conductivity type, which is formed on said semiconductor substrate by epitaxial growth, a breakdown voltage control layer of the second conductivity type formed on said carrier multiplication layer and having a dopant concentration higher than that of said carrier multiplication layer, a first insulating layer consisting of a nitride, said insulating layer being formed on said breakdown voltage control layer, a surface of said breakdown voltage control layer functioning as a receptor for said photoelectrons, and said carrier multiplication layer and an ohmic electrode layer formed on a peripheral surface portion of said receptor of said breakdown voltage control layer.

2. A photomultiplier according to claim 1, further comprising an electron lens, arranged between said photocathode and said semiconductor device, for focusing the photoelectrons emitted from said photocathode and guiding the photoelectrons to said receptor of said breakdown voltage control layer, and wherein said receptor of said breakdown voltage control layer has a diameter of not more than 10 mm.

3. A photomultiplier according to claim 2, wherein a stem of said envelope is formed of a conductive material, and said semiconductor substrate is arranged on a vacuum-side surface of said stem.

4. A photomultiplier according to claim 3, wherein said electron lens is constituted by a first focusing electrode arranged near said photocathode and electrically connected to said photocathode, and a second focusing electrode arranged near said stem and electrically connected to said stem.

5. A photomultiplier according to claim 4, wherein said stem further includes a terminal rod, arranged to hermetically extend through said stem while being electrically insulated from said stem, for applying a voltage to said ohmic electrode layer.

6. A photomultiplier according to claim 1, wherein said carrier multiplication layer is formed by epitaxial growth on the basis of chemical vapor deposition.

7. A photomultiplier according to claim 1, wherein said semiconductor device further includes a second insulating layer consisting of an oxide, said second insulating layer being formed between said first insulating layer and semiconductor layers composed of said breakdown voltage control layer and said carrier multiplication layer.

8. A photomultiplier according to claim 1, wherein said semiconductor device further includes a guard ring layer of the first conductivity type formed on a surface of said semiconductor substrate in a region located around said carrier multiplication layer, and said first insulating layer is further formed on said guard ring layer.

9. A photomultiplier according to claim 8, wherein said first insulating layer is further formed on an isolation groove formed by partially removing said guard ring layer and dividing said guard ring layer into two portions to expose a surface of said semiconductor substrate.

10. A photomultiplier according to claim 8, wherein said semiconductor device further includes a second insulating layer consisting of an oxide, said second insulating layer being formed between said first insulating layer and semiconductor layers composed of said breakdown voltage control layer, said carrier multiplication layer and said guard ring layer.

11. A photomultiplier according to claim 1, wherein the dopant concentration of said carrier multiplication layer is set to a value for forming a depletion layer extending from said semiconductor substrate to said breakdown voltage control layer in said carrier multiplication layer on the basis of a reverse bias voltage close to a breakdown voltage applied between said semiconductor substrate and said ohmic electrode layer.

12. A photomultiplier according to claim 11, wherein said carrier multiplication layer is formed by doping Si with B as a p-type dopant at a concentration of $10^{14}$ to $10^{16}$ cm$^{-3}$.

13. A photomultiplier according to claim 1, wherein a thickness of said carrier multiplication layer is set to a value for ensuring a distance for generating secondary carriers from the photoelectrons at a predetermined gain and a distance for avalanche-multiplying the secondary carriers at a predetermined gain, and holding a uniform dopant concentration in a direction of thickness by epitaxial growth.

14. A photomultiplier according to claim 13, wherein said carrier multiplication layer has a thickness of 5 to 50 μm and is formed of Si.

* * * * *